(12) United States Patent
Wakaoka et al.

(10) Patent No.: US 11,359,869 B2
(45) Date of Patent: Jun. 14, 2022

(54) VAPOR CHAMBER

(71) Applicant: Murata Manufacturing Co., Ltd., Nagaokakyo (JP)

(72) Inventors: Takuo Wakaoka, Nagaokakyo (JP); Yushiro Murashige, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 101 days.

(21) Appl. No.: 16/847,865

(22) Filed: Apr. 14, 2020

(65) Prior Publication Data

US 2020/0240718 A1 Jul. 30, 2020

Related U.S. Application Data

(63) Continuation of application No. PCT/JP2019/028980, filed on Jul. 24, 2019.

(30) Foreign Application Priority Data

Jul. 31, 2018 (JP) .............................. JP2018-143960

(51) Int. Cl.
*F28D 15/04* (2006.01)

(52) U.S. Cl.
CPC .................................. *F28D 15/04* (2013.01)

(58) Field of Classification Search
CPC .......... F28D 15/04; F28D 15/046; F28D 1/03; H05K 7/20336; H05K 7/2029; H01L 23/427
See application file for complete search history.

(56) References Cited

U.S. PATENT DOCUMENTS

| 5,694,295 A | 12/1997 | Mochizuki et al. |
| 10,119,770 B2 | 11/2018 | Aoki et al. |
| 10,544,994 B2 | 1/2020 | Wakaoka et al. |

(Continued)

FOREIGN PATENT DOCUMENTS

| JP | H04363588 A | 12/1992 |
| JP | H09210582 A | 8/1997 |

(Continued)

OTHER PUBLICATIONS

International Search Report Issued for PCT/JP2019/028980, dated Oct. 8, 2019.

(Continued)

*Primary Examiner* — Tho V Duong
(74) *Attorney, Agent, or Firm* — ArentFox Schiff LLP

(57) ABSTRACT

A vapor chamber that includes a housing having a first sheet and a second sheet that oppose each other and are joined to each other in a peripheral region of the housing, a working liquid in an internal space of the housing, a wick structure on a principal surface of the first sheet that opposes the second sheet, and multiple pillars on a principal surface of the second sheet that opposes the first sheet. In the vapor chamber, the first sheet includes an inclined portion that is disposed along at least part of the peripheral region of the housing and is inclined in a height direction toward a joint portion with the second sheet. In addition, a first portion of the second sheet at the joint portion heightwise overlaps a second portion of the second sheet in a second region in contact with the pillars.

6 Claims, 2 Drawing Sheets

(56) References Cited

U.S. PATENT DOCUMENTS

| | | | |
|---|---|---|---|
| 2003/0136551 A1* | 7/2003 | Bakke | F28D 15/0233 |
| | | | 165/104.26 |
| 2006/0098411 A1 | 5/2006 | Lee et al. | |
| 2007/0295486 A1* | 12/2007 | Su | F28D 15/0233 |
| | | | 165/104.26 |
| 2008/0040925 A1 | 2/2008 | Lee et al. | |
| 2009/0040726 A1* | 2/2009 | Hoffman | F28D 15/0233 |
| | | | 361/700 |
| 2010/0065255 A1* | 3/2010 | Liu | H05K 7/20336 |
| | | | 165/104.26 |
| 2010/0157535 A1 | 6/2010 | Oniki et al. | |
| 2011/0088877 A1 | 4/2011 | Oniki et al. | |
| 2011/0232876 A1* | 9/2011 | Chang | F28D 15/0233 |
| | | | 165/104.26 |
| 2015/0060022 A1* | 3/2015 | Sun | F28D 15/04 |
| | | | 165/104.26 |
| 2017/0248378 A1 | 8/2017 | Aoki et al. | |
| 2018/0010861 A1 | 1/2018 | Wakaoka et al. | |
| 2020/0025457 A1* | 1/2020 | Lin | F28F 3/12 |
| 2020/0124352 A1 | 4/2020 | Wakaoka et al. | |

FOREIGN PATENT DOCUMENTS

| | | |
|---|---|---|
| JP | 2006140435 A | 6/2006 |
| JP | 2010151354 A | 7/2010 |
| JP | 2011085311 A | 4/2011 |
| JP | 2016050713 A | 4/2016 |
| TW | 201300718 A | 1/2013 |
| WO | 2016151916 A1 | 9/2016 |

OTHER PUBLICATIONS

Written Opinion of the International Searching Authority issued for PCT/JP2019/028980, dated Oct. 8, 2019.

* cited by examiner

FIG. 5 – PRIOR ART
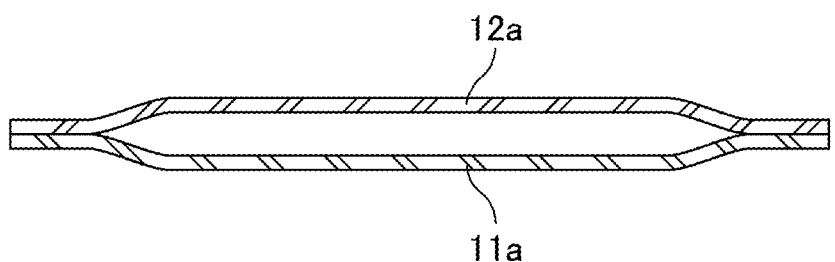
FIG. 6 – PRIOR ART
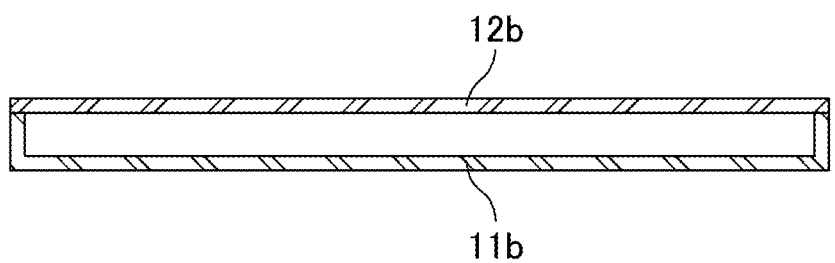
FIG. 7 – PRIOR ART
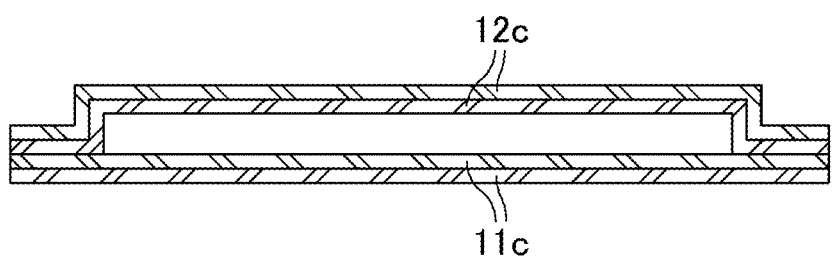

VAPOR CHAMBER

CROSS REFERENCE TO RELATED APPLICATIONS

The present application is a continuation of International application No. PCT/JP2019/028980, filed Jul. 24, 2019, which claims priority to Japanese Patent Application No. 2018-143960, filed Jul. 31, 2018, the entire contents of each of which are incorporated herein by reference.

FIELD OF THE INVENTION

The present invention relates to a vapor chamber.

BACKGROUND OF THE INVENTION

In recent years, an amount of heat generated by a microelectronics device has tended to increase due to high degree of integration and demand for high performance. Meanwhile, a product has become smaller in size, which causes heat generation density to increase. Dissipating heat has thus become an important issue. This situation is found especially in the field of mobile terminals, such as smartphones and tablet devices, and the thermal design thereof faces increasing difficulties. A graphite sheet or the like has been often adopted as a heat dissipating member. However, the heat transport capacity of the graphite sheet is not large enough.

A heat dissipating member having a high heat transport capacity is a vapor chamber, which is a sheet-type heat pipe. The vapor chamber as a whole exhibits an apparent thermal conductivity several times to several tens of times higher than a metal, such as copper or aluminum.

As disclosed in Patent Documents 1 to 3, the vapor chamber is generally structured so as to include a housing in which a working liquid and a wick is enclosed. The wick structure transports the working liquid by using capillary forces. The working liquid absorbs heat from a device that generates the heat and evaporates at an evaporation section of the vapor chamber. The vapor-phase working liquid moves to a condensation section where the working liquid is cooled and returns to the liquid phase. The working liquid after returning to the liquid phase moves toward the device that generates heat (i.e., toward the evaporation section) due to the capillary forces of the wick structure and thereby cools the heat generating device. By repeating this cycle self-supportedly without using external power, the vapor chamber can quickly dissipate heat two-dimensionally by utilizing the latent heat of vaporization and condensation of the working liquid.

Patent Document 1: International Publication No. 2016/151916

Patent Document 2: Japanese Unexamined Patent Application Publication No. 2011-85311

Patent Document 3: Japanese Unexamined Patent Application Publication No. 2016-50713

SUMMARY OF THE INVENTION

FIG. 5 is a cross-sectional view schematically illustrating an example of a housing included in a vapor chamber described in Patent Document 1.

As illustrated in FIG. 5, the housing included in the vapor chamber described in Patent Document 1 includes a first sheet 11a and a second sheet 12a that are both shaped like cups and joined to each other.

As illustrated in FIG. 5, the vapor chamber is structured such that both of the first sheet 11a and the second sheet 12a incline in the vicinity of a joint portion in a depressed manner so as to narrow a cavity. The cavity is a path for a vapor-phase working liquid. If the cavity narrows in the vicinity of the joint portion, the heat soaking capability of the vapor chamber may be impaired. In addition, in the case of the vapor chamber being bent, stresses are concentrated on the inclined portions of the first sheet 11a and the second sheet 12a.

FIG. 6 is a cross-sectional view schematically illustrating an example of a housing included in a vapor chamber described in Patent Document 2.

As illustrated in FIG. 6, the housing included in the vapor chamber described in Patent Document 2 includes a saucer-like first sheet 11b having a recess and a tabular shaped second sheet 12b that are joined to each other.

FIG. 7 is a cross-sectional view schematically illustrating an example of a housing included in a vapor chamber described in Patent Document 3.

As illustrated in FIG. 7, the housing included in the vapor chamber described in Patent Document 3 includes a two-layer first sheet 11c and a two-layer second sheet 12c that are joined to each other. The first sheet 11c is tabular shaped. The second sheet 12c is also tabular shaped but is plastically deformed so as to have a convex portion at the center.

In the structures illustrated in FIGS. 6 and 7, one of the sheets that forms the housing is bent by 90 degrees. Accordingly, when the vapor chamber is bent, stresses are concentrated on the corners of the sheet bent by 90 degrees.

The present invention is made to solve the above problems. An object of the present invention is to provide a vapor chamber in which the cavity is formed up to a position near the joint portion of the sheets that constitutes the housing and thereby the housing is not readily subjected to stresses.

A vapor chamber according to the present invention includes a housing having a first sheet and a second sheet that oppose each other, that are joined to each other in a peripheral region of the housing, and that define an internal space, a working liquid enclosed in the internal space of the housing, a wick structure on an internal principal surface of the first sheet that opposes the second sheet, and multiple pillars on an internal principal surface of the second sheet that opposes the first sheet. In the vapor chamber, the first sheet includes an inclined portion that is disposed along at least part of the peripheral region of the housing and is inclined in a height direction of the housing toward a joint portion where the first sheet is joined to the second sheet. In addition, a first portion of the second sheet in a first region in contact with the joint portion to which the inclined portion of the first sheet extends to heightwise overlaps a second portion of the second sheet in a second region that is in contact with the pillars as viewed in a direction orthogonally intersecting a direction in which the first sheet and the second sheet oppose each other.

With the present invention, a vapor chamber in which the cavity is formed up to a position near the joint portion of the sheets constituting the housing and thereby the housing is not readily subjected to stresses can be provided.

BRIEF DESCRIPTION OF THE DRAWINGS

FIG. 5 is a cross-sectional view schematically illustrating an example of a housing included in a vapor chamber described in Patent Document 1.

FIG. 6 is a cross-sectional view schematically illustrating an example of a housing included in a vapor chamber described in Patent Document 2.

FIG. 7 is a cross-sectional view schematically illustrating an example of a housing included in a vapor chamber described in Patent Document 3.

DETAILED DESCRIPTION OF THE PREFERRED EMBODIMENTS

A vapor chamber according to the present invention will be described below.

The present invention, however, is not limited to the configurations described below. The present invention can be applied in appropriately modified forms insofar as the modified forms stay within the spirit of the present invention. Note that two or more of individual desirable configurations of the present invention described herein may be combined together, and such a combination is deemed within the scope of the present invention.

It should be understood that embodiments described below are merely examples and configurations described in different embodiments can be partially combined, or replaced, with each other. In the description of the second embodiment or thereafter, description of the same components that are already described in the first embodiment will be omitted, and only differences will be described. Advantageous effects obtained by using a similar configuration will not be described repeatedly for each embodiment.

In the following description, the vapor chamber is described simply as the "vapor chamber of the present invention" when it is not necessary to differentiate vapor chambers of different embodiments from each other.

First Embodiment

A vapor chamber according to a first embodiment of the present invention includes a second sheet having a portion that is in contact with a joint portion to which an inclined portion of a first sheet extends to, and the portion of the second sheet has the same thickness as that of a portion of the second sheet that is not in contact with pillars of the vapor chamber.

Figure 1:
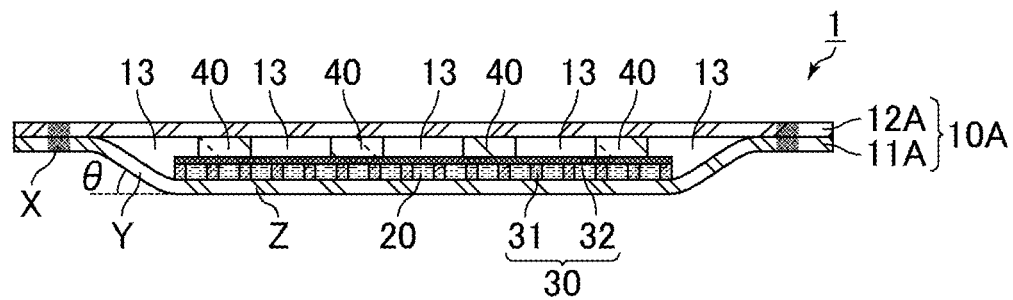
FIG. 1 is a cross-sectional view schematically illustrating an example of a vapor chamber according to a first embodiment of the present invention.

FIG. 1 is a cross-sectional view schematically illustrating an example of a vapor chamber according to the first embodiment of the present invention.

A vapor chamber 1 illustrated in FIG. 1 includes a housing 10A, a working liquid 20, a wick structure 30, and multiple pillars 40. The housing 10A is formed of a first sheet 11A and a second sheet 12A that oppose each other. The working liquid 20 is enclosed in the internal space of the housing 10A. The wick structure 30 is disposed on a principal surface of the first sheet 11A that opposes the second sheet 12A, and the pillars 40 are disposed on a principal surface of the second sheet 12A that opposes the first sheet 11A. The housing 10A has a cavity 13 therein, and the first sheet 11A and the second sheet 12A are supported by the pillars 40 so as to maintain the cavity 13. The first sheet 11A and the second sheet 12A are joined to, and sealed with, each other at peripheral regions thereof. In the vapor chamber 1 illustrated in FIG. 1, the wick structure 30 includes multiple protrusions 31 that are disposed at predetermined intervals on the inside surface of the first sheet 11A and also includes a mesh 32 that is disposed on the protrusions 31.

In the vapor chamber 1 illustrated in FIG. 1, the first sheet 11A has an inclined portion Y disposed along the entire peripheral region of the housing 10A. The inclined portion Y inclines in a direction in which the first sheet 11A and the second sheet 12A oppose each other (i.e., in the height direction) and extends toward a joint portion X of the first sheet 11A and the second sheet 12A. More specifically, the first sheet 11A has a bottom portion Z on which the wick structure 30 is disposed. The inclined portion Y inclines in the height direction and extends from the bottom portion Z toward the joint portion X of the first sheet 11A and the second sheet 12A so as to expand the cavity 13 laterally toward the joint portion X. In FIG. 1, an angle between the inclined portion Y and an extension line of bottom portion Z of the first sheet 11A is referred to as an "angle θ of inclined portion Y" of the first sheet 11A. Note that the extension line of the bottom portion Z extends in the extending direction of principal surface of the first sheet 11A that is opposite to the principal surface that opposes the second sheet 12A. In the case of the first sheet 11A having a slight irregularity on the principal surface not opposing the second sheet 12A, the angle θ of the inclined portion Y can be obtained by bringing the principal surface of the first sheet 11A not opposing the second sheet 12A into contact with a flat surface, which is not an element included in the vapor chamber 1, and by measuring the angle between the flat surface and the inclined portion Y.

On the other hand, the second sheet 12A does not substantially incline in the height direction toward the joint portion of the first sheet 11A and the second sheet 12A in the entire peripheral region of the housing 10A. In addition, the thickness of the second sheet 12A at the joint portion X to which the inclined portion Y of the first sheet 11A extends to is the same as the thickness of the second sheet 12A at a position not in contact with the pillars 40.

Accordingly, the outside surface of the second sheet 12A in a region in which the second sheet 12A is in contact with the joint portion X to which the inclined portion Y of the first sheet 11A extends to is in the same plane as that of the outside surface of the second sheet 12A in a region in which the second sheet 12A is in contact with the pillars 40.

The vapor chamber according to the first embodiment of the present invention is characterized in that the portion of the second sheet in the region in contact with the joint portion heightwise overlaps the portion of the second sheet in the region in contact with the pillars as viewed in a direction orthogonally intersecting the direction in which the first sheet and the second sheet oppose each other.

In the vapor chamber according to the first embodiment of the present invention, it is ideal to have the height of the outside surface of the second sheet in the region in contact with the joint portion at the same height of the outside surface of the second sheet in the region in contact with the pillars as viewed in a direction orthogonally intersecting the direction in which the first sheet and the second sheet oppose each other. However, it may be sufficient that the portion of the second sheet in the region in contact with the joint portion is positioned so as to heightwise overlap at least part of the second sheet in the region in contact with the pillars.

The portion of the second sheet in the region in contact with the joint portion preferably is positioned so as to heightwise overlap the portion of the second sheet in the region in contact with the pillars. In this case, the cavity is made available near the second sheet and can be made wider so as to accommodate a vapor-phase working liquid up to the vicinity of the joint portion, which is different from the configuration illustrated in FIG. 5. As a result, the heat soaking capability of the vapor chamber can be improved. In addition, this makes it easier to form the joint portion flatly, which can improve airtightness. In addition, the first sheet has a larger inclined portion compared with the configuration illustrated in FIG. 5. As a result, when the vapor-phase working liquid is cooled and returned to the liquid phase, the liquid-phase working liquid can move back along the inclined portion to the wick structure easily.

Second Embodiment

In a vapor chamber according to a second embodiment of the present invention, a portion of the second sheet that is in contact with the joint portion to which the inclined portion of the first sheet extends to has the same thickness as the sum of the thickness of the portion of the second sheet that is in contact with pillars and the height of the pillars.

Figure 2:
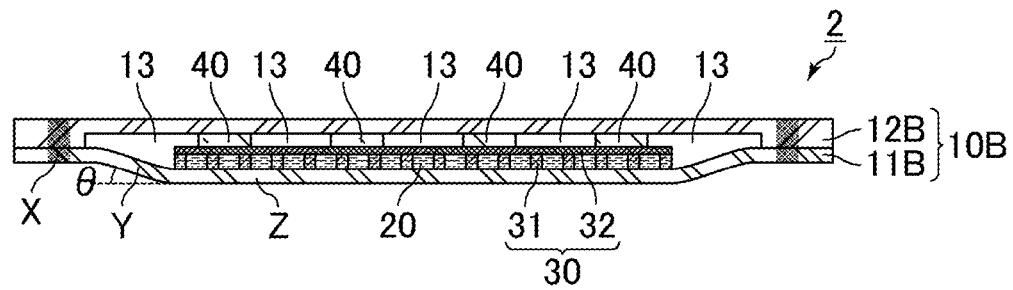
FIG. 2 is a cross-sectional view schematically illustrating an example of a vapor chamber according to a second embodiment of the present invention.

FIG. 2 is a cross-sectional view schematically illustrating an example of a vapor chamber according to the second embodiment of the present invention.

A vapor chamber 2 illustrated in FIG. 2 includes a housing 10B, the working liquid 20, the wick structure 30, and the multiple pillars 40. The housing 10B is formed of a first sheet 11B and a second sheet 12B that oppose each other. The working liquid 20 is enclosed in the internal space of the housing 10B. The wick structure 30 is disposed on a principal surface of the first sheet 11B that opposes the second sheet 12B, and the pillars 40 are disposed on a principal surface of the second sheet 12B that opposes the first sheet 11B. The housing 10B has the cavity 13 therein, and the pillars 40 support the first sheet 11B and the second sheet 12B to maintain the cavity 13. The first sheet 11B and the second sheet 12B are joined to, and sealed with, each other at peripheral regions thereof. In the vapor chamber 2 illustrated in FIG. 2, the wick structure 30 includes multiple protrusions 31 that are disposed at predetermined intervals on the inside surface of the first sheet 11B and also includes a mesh 32 that is disposed on the protrusions 31.

In the vapor chamber 2 illustrated in FIG. 2, the first sheet 11B has an inclined portion Y disposed along the entire peripheral region of the housing 10B. The inclined portion Y inclines in the height direction and extends toward a joint portion X of the first sheet 11B and the second sheet 12B. More specifically, the first sheet 11B has a bottom portion Z on which the wick structure 30 is disposed. The inclined portion Y inclines in the height direction and extends from the bottom portion Z toward the joint portion X of the first sheet 11B and the second sheet 12B so as to expand the cavity 13 laterally toward the joint portion X. In FIG. 2, an angle between the inclined portion Y and an extension line of bottom portion Z of the first sheet 11B is referred to as an "angle θ of inclined portion Y" of the first sheet 11B. Note that the extension line of the bottom portion Z extends in the extending direction of the principal surface of the first sheet 11B that does not oppose the second sheet 12B. In the case of the first sheet 11B having a slight irregularity on the principal surface not opposing the second sheet 12B, the angle θ of the inclined portion Y can be obtained by bringing the principal surface of the first sheet 11B not opposing the second sheet 12B into contact with a flat surface, which is not an element included in the vapor chamber 2, and by measuring the angle between the flat surface and the inclined portion Y.

On the other hand, the second sheet 12B does not substantially incline in the height direction toward the joint portion of the first sheet 11B and second sheet 12B in the entire peripheral region of the housing 10B. In addition, the thickness of the second sheet 12B at the joint portion X to which the inclined portion Y of the first sheet 11B extends to is the same as the sum of the thickness of the second sheet 12B at a position in contact with the pillars 40 and the height of the pillars 40. Accordingly, the outside surface of the second sheet 12B in a region in which the second sheet 12B is in contact with the joint portion X to which the inclined portion Y of the first sheet 11B extends to is in the same plane as that of the outside surface of the second sheet 12B in a region in which the second sheet 12B is in contact with the pillars 40.

As is the case for the vapor chamber according to the first embodiment of the present invention, the vapor chamber according to the second embodiment of the present invention is also characterized in that the portion of the second sheet in the region in contact with the joint portion heightwise overlaps the portion of the second sheet in the region in contact with the pillars as viewed in a direction orthogonally intersecting the direction in which the first sheet and the second sheet oppose each other.

In the vapor chamber according to the second embodiment of the present invention, it is ideal to have the height of the outside surface of the second sheet in the region in contact with the joint portion at the same height of the outside surface of second sheet in the region in contact with the pillars as viewed in a direction orthogonally intersecting the direction in which the first sheet and the second sheet oppose each other. However, it may be sufficient that the portion of the second sheet in the region in contact with the joint portion is positioned so as to heightwise overlap at least part of the second sheet in the region in contact with the pillars.

Third Embodiment

In a vapor chamber according to a third embodiment of the present invention, the first sheet has an inclined portion disposed only in part of the peripheral region of the housing instead of having the inclined portion disposed in the entire peripheral region of the housing as is the case for the vapor chambers of the first and second embodiments of the present invention. In the vapor chamber according to the third embodiment of the present invention, a portion of the second sheet in the region in contact with the joint portion to which the inclined portion of the first sheet extends to is positioned in part of peripheral region of the housing so as to heightwise overlap the portion of the second sheet in the region in contact with the pillars. In the other part of peripheral region of the housing, the first sheet need not include the inclined portion. In other words, the portion of the second sheet in the region in contact with the joint portion to which the inclined portion of the first sheet extends to may have a part that is not positioned so as to heightwise overlap the portion of the second sheet in the region in contact with pillars.

Figure 3:
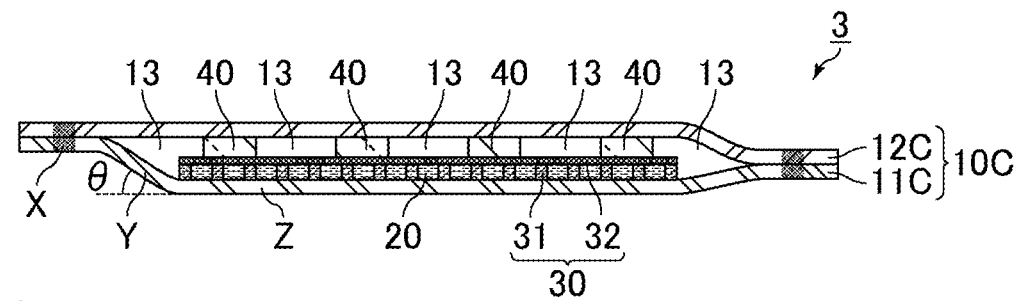
FIG. 3 is a cross-sectional view schematically illustrating an example of a vapor chamber according to a third embodiment of the present invention.

FIG. 3 is a cross-sectional view schematically illustrating an example of the vapor chamber according to the third embodiment of the present invention.

A vapor chamber 3 illustrated in FIG. 3 includes a housing 10C, the working liquid 20, the wick structure 30, and the multiple pillars 40. The housing 10C is formed of a first sheet 11C and a second sheet 12C that oppose each other. The working liquid 20 is enclosed in the internal space of the housing 10C. The wick structure 30 is disposed on a principal surface of the first sheet 11C that opposes the second sheet 12C, and the pillars 40 are disposed on a principal surface of the second sheet 12C that opposes the first sheet 11C. The housing 10C has a cavity 13 therein, and the pillars 40 support the first sheet 11C and the second sheet 12C so as to maintain the cavity 13. The first sheet 11C and the second sheet 12C are joined to, and sealed with, each other at peripheral regions thereof. In the vapor chamber 3 illustrated in FIG. 3, the wick structure 30 includes multiple protrusions 31 that are disposed at predetermined intervals on the inside surface of the first sheet 11C and also includes a mesh 32 that is disposed on the protrusions 31.

In the vapor chamber 3 illustrated in FIG. 3, the first sheet 11C has an inclined portion Y disposed along part of peripheral region of the housing 10C (i.e., the peripheral region on the left in FIG. 3). The inclined portion Y inclines in the direction in which the first sheet 11C and the second sheet 12C oppose each other and extends toward the joint portion X of the first sheet 11C and the second sheet 12C. More specifically, the first sheet 11C has the bottom portion Z on which the wick structure 30 is disposed. The inclined portion Y inclines in the height direction and extends from the bottom portion Z toward the joint portion X of the first sheet 11C and the second sheet 12C so as to expand the cavity 13 laterally toward the joint portion X. In FIG. 3, an angle between the inclined portion Y and an extension line of bottom portion Z of the first sheet 11C is referred to as an "angle θ of inclined portion Y" of the first sheet 11C. Note that the extension line of the bottom portion Z extends in the same direction as the extending direction of the principal surface of the first sheet 11C that does not oppose the second sheet 12C. In the case of the first sheet 11C having a slight irregularity on the principal surface not opposing the second sheet 12C, the angle θ of the inclined portion Y can be obtained by bringing the principal surface of the first sheet 11C not opposing the second sheet 12C into contact with a flat surface, which is not an element included in the vapor chamber 3, and by measuring the angle between the flat surface and the inclined portion Y.

On the other hand, the second sheet 12C does not substantially incline in the height direction toward the joint portion of the first sheet 11C and second sheet 12C in part of the peripheral region of the housing 10C, in other words, in the region in contact with the joint portion X to which the inclined portion Y of the first sheet 11C extends to. In addition, the thickness of the second sheet 12C at the joint portion X to which the inclined portion Y of the first sheet 11C extends to is the same as the thickness of the second sheet 12C at a position not in contact with the pillars 40. Accordingly, the outside surface of the second sheet 12C in the region in which the second sheet 12C is in contact with the joint portion X to which the inclined portion Y of the first sheet 11C extends to is in the same plane as that of the outside surface of the second sheet 12C in the region in which the second sheet 12C is in contact with the pillars 40. In the other part of peripheral region of the housing 10C (i.e., the peripheral region on the right in FIG. 3), the outside surface of the second sheet 12C may be in a different plane.

As is the case for the vapor chamber according to the first embodiment of the present invention, the vapor chamber according to the third embodiment of the present invention is also characterized in that the portion of the second sheet in the region in contact with the joint portion heightwise overlaps the portion of the second sheet in the region in contact with the pillars as viewed in a direction orthogonally intersecting the direction in which the first sheet and the second sheet oppose each other.

In the vapor chamber according to the third embodiment of the present invention, it is ideal to have the height of the outside surface of the second sheet in the region in contact with the joint portion to which the inclined portion of the first sheet extends to at the same height of the outside surface of second sheet in the region in contact with the pillars as viewed in a direction orthogonally intersecting the direction in which the first sheet and the second sheet oppose each other. However, it may be sufficient that the portion of the second sheet in the region in contact with the joint portion to which the inclined portion of the first sheet extends to is positioned so as to heightwise overlap at least part of the second sheet in the region in contact with the pillars.

In the vapor chamber according to the third embodiment of the present invention, the thickness of portion of the second sheet in contact with the joint portion may be the same as the thickness of the portion of the second sheet not in contact with the pillars as in the first embodiment of the present invention. Alternatively, the thickness of the portion of the second sheet in contact with the joint portion may also be the same as the sum of the thickness of the portion of the second sheet in contact with pillars and the height of the pillars as in the second embodiment of the present invention.

The shape of the housing is not specifically limited in the vapor chamber of the present invention.

For example, the shape of the housing in plan view (the shape of vapor chambers of FIGS. 1 to 3 as viewed from above) may be a polygon such as a triangle or a rectangle, a circle, an oval, or a combination thereof.

In the vapor chamber of the present invention, the first sheet and the second sheet that constitute the housing may be overlaid with respective ends being aligned with each other or slightly deviating from each other.

In the vapor chamber of the present invention, the materials of the first sheet and the second sheet are not specifically limited insofar as they have characteristics appropriate for the vapor chamber in terms of thermal conductivity, strength, and flexibility, for example. The materials of first sheet and the second sheet may be preferably a metal, for example, copper, nickel, aluminum, magnesium, titan, iron, or an alloy containing such metals as main ingredients. The material of the first sheet and the second sheet may be more preferably copper.

In the vapor chamber of the present invention, the materials of the first sheet and the second sheets may be different from each other. For example, a material having a high strength may be used for the first sheet, which can thereby disperse stresses applied to the housing. Using different materials can provide one sheet with one function and the other sheet with an additional function. These functions are not specifically limited here, but may be, for example, a function of thermal conductivity or a function of a shield against electromagnetic waves.

In the vapor chamber of the present invention, the thicknesses of the first sheet and the second sheet are not specifically limited. However, in the case of the first sheet and the second sheet being too thin, the strength of the housing decreases, which leads to vulnerability to deformation. Accordingly, respective thicknesses of the first and the second sheets are preferably 20 μm or more, and more preferably 30 μm or more. On the other hand, in the case of the first sheet and the second sheet being too thick, it becomes difficult to reduce the entire thickness of the vapor chamber. Accordingly, respective thicknesses of the first and the second sheets are preferably 200 μm or less, more preferably 150 μm or less, and even more preferably 100 μm or less. The first sheet and the second sheet may have the same thickness or may have different thicknesses.

Note that in the case of the first sheet being integrally formed with protrusions that constitute the wick structure, the thickness of the first sheet is measured at a position not in contact with the protrusions. In the case of the second sheet being integrally formed with the pillars, the thickness of the second sheet is measured at a position not in contact with the pillars.

In the vapor chamber of the present invention, the first sheet may have a constant thickness or may have a thick portion and a thin portion. Similarly, the second sheet may have a constant thickness or may have a thick portion and a thin portion. The portion of the second sheet that is not in contact with the pillars may be recessed into the housing.

In the vapor chamber of the present invention, the angle of inclined portion of the first sheet as viewed in cross section (the angle indicated by θ in FIGS. 1, 2, and 3) is preferably 1° to 17°.

In the case of the angle of inclined portion of the first sheet being too small, the vapor-phase working liquid may not return smoothly, which may lead to an increase in the temperature of the vapor chamber. On the other hand, in the case of the angle of inclined portion of the first sheet being too large, stresses applying to the joint portion of the first sheet and the second sheet increase, which may cause damage to the joint portion and may lead to leakage.

Accordingly, setting the angle of inclined portion of the first sheet to be 1° to 17° can reduce the temperature increase in the vapor chamber and also can alleviate stresses applying to the joint portion.

In the vapor chamber of the present invention, the working liquid is not specifically limited insofar as the working liquid is subjected to vapor-liquid phase change in the environment inside the housing. The working liquid may be, for example, water, an alcohol, or an alternative fluorocarbon. The working liquid is preferably an aqueous compound, and more preferably water.

In the vapor chamber of the present invention, the wick structure is not specifically limited insofar as the wick structure has a capillary structure that enables the working liquid to move by capillary forces. The capillary structure may be a known structure used in a known vapor chamber. For example, the capillary structure may encompass micro structures having irregularities, such as pores, grooves, or protrusions. In other words, the capillary structure may encompass a porous structure, a fibrous structure, a pleated structure, or a reticular structure.

In the vapor chamber of the present invention, the wick structure is preferably disposed continuously from the evaporation section to the condensation section inside the housing. At least part of the wick structure may be integrally formed with the housing.

In the vapor chamber of the present invention, the wick structure may include a mesh, a nonwoven fabric, or a porous member disposed on a surface of the structure that does not oppose the inside surface of the first sheet. For example, the wick structure may include multiple protrusions disposed at predetermined intervals on the inside surface of the first sheet and may also include the mesh, the nonwoven fabric, or the porous member disposed on the protrusions. Alternatively, the wick structure may include the mesh, the nonwoven fabric, or the porous member disposed directly on the inside surface of the first sheet.

In the vapor chamber of the present invention, the first sheet includes the inclined portion as described above. Accordingly, in the case of displacement occurring, the mesh, the nonwoven fabric, or the porous member that constitutes the wick structure returns easily to the original position along the inclined portion, which suppresses positional deviation of the wick structure.

In the vapor chamber of the present invention, in the case of the wick structure including the protrusions disposed on the inside surface of the first sheet, the working liquid can be retained between the protrusions, which improves the heat transport capacity of the vapor chamber.

In the present description, a "protrusion" refers to a high portion relative to the surrounding area. Each protrusion may be formed as a portion protruding from the inside surface or may be formed as a relatively high portion formed by a recess, such as a groove, in the inside surface.

The shape of each protrusion is not specifically limited but may be formed, for example, as a circular column, a rectangular column, a truncated cone, or a truncated pyramid. The shape of the protrusion may be like a wall, in other words, may be such that a groove is formed between adjacent protrusions.

The protrusions may be formed integrally with the first sheet. For example, the protrusions may be formed by etching the inside surface of the first sheet.

In the vapor chamber of the present invention, the pillars support the first sheet and the second sheet from inside. Disposing the pillars inside the housing can suppress deformation of the housing in such a case that, for example, the inside of the housing is depressurized or an external pressure is applied to the housing. Note that the pillars may be in contact with the first sheet and the second sheet and support them directly. Alternatively, the pillars may support them with other members, for example wick structures, interposed therebetween.

The shape of each pillar is not specifically limited but may be formed, for example, into a circular column, a rectangular column, a truncated cone, or a truncated pyramid.

The pattern of arranging the pillars is not specifically limited but may be preferably an equidistant arrangement, such as a grid-like pattern in which the pillars are disposed at equidistant grid points. The equidistant arrangement of the pillars provides the entire vapor chamber with a uniform strength.

The pillars may be integrally formed with the second sheet. For example, the pillars may be formed by etching the inside surface of the second sheet.

The method of manufacturing the vapor chamber of the present invention is not specifically limited insofar as the above-described configurations are obtained. For example, the first sheet having the wick structure disposed thereon and the second sheet having the pillars disposed thereon are overlaid and joined to each other while an opening portion for pouring the working liquid therethrough remains open. After the working liquid is poured into the housing from the opening portion, the opening portion is sealed.

The method of joining the first sheet and the second sheet to each other is not specifically limited but may utilize, for example, laser welding, resistance welding, diffusion bonding, soldering, TIG arc welding (tungsten inert-gas arc welding), ultrasonic bonding, or plastic molding. Of these methods, laser welding, resistance welding, and soldering may be preferably used.

Fourth Embodiment

A vapor chamber according to a fourth embodiment of the present invention further includes a support member that supports at least the inclined portion of the first sheet from the outside.

For example, the vapor chamber according to the fourth embodiment of the present invention is such that the vapor chamber shown in any of FIGS. 1-3 can include the support member.

Figure 4:
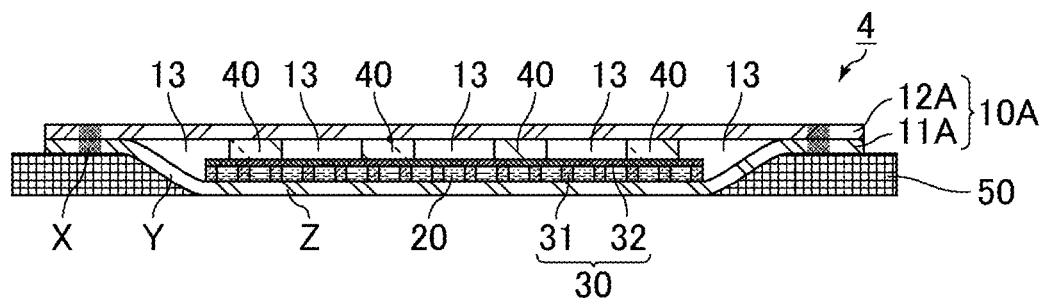
FIG. 4 is a cross-sectional view schematically illustrating an example of a vapor chamber according to a fourth embodiment of the present invention.

FIG. 4 is a cross-sectional view schematically illustrating an example of the vapor chamber according to the fourth embodiment of the present invention.

A vapor chamber 4 illustrated in FIG. 4 includes the housing 10A, the working liquid 20, the wick structure 30, the multiple pillars 40, and a support member 50. The vapor chamber 4 illustrated in FIG. 4 is such that the vapor chamber 1 of FIG. 1 includes the support member 50.

In the vapor chamber 4 illustrated in FIG. 4, the support member 50 is a frame member that supports the joint portion X and the inclined portion Y of the first sheet 11A from outside.

In the vapor chamber according to the fourth embodiment of the present invention, the shape of the support member is not specifically limited insofar as the support member supports at least the inclined portion of the first sheet from outside. However, the support member preferably has a shape that does not leave a gap between the support member and the inclined portion of the first sheet.

In the vapor chamber according to the fourth embodiment of the present invention, the support member may be a frame member or may be a tabular shaped member.

In the case of the support member being the frame member, the support member may support only the inclined portion of the first sheet or may support the joint portion and the inclined portion of the first sheet together.

In the case of the support member being the tabular shaped member, the support member preferably supports the bottom portion and the inclined portion of the first sheet or may also support the joint portion of the first sheet in addition to the bottom portion and the inclined portion.

In the vapor chamber according to the fourth embodiment of the present invention, it is preferable that the material of the support member have a thermal conductivity smaller than that of material of the first sheet and the second sheet. Accordingly, heat is not readily conducted to members disposed outside the vapor chamber.

In the vapor chamber according to the fourth embodiment of the present invention, the material of the support member may be, for example, a stainless steel (for example, SUS 304), aluminum, or a resin.

Other Embodiment

The vapor chamber of the present invention is not limited to the embodiments described above but may be subjected to alterations and modifications in the configurations, manufacturing conditions, etc., of the vapor chamber within the scope of the present invention.

For example, the vapor chamber of the present invention may include the wick structure disposed on a principal surface of the second sheet that is the principal surface opposing the first sheet. In this case, the pillars, which are not directly in contact with the second sheet, support the second sheet with the wick structure being interposed therebetween.

The vapor chamber according to the present invention has a high heat transport capacity and a high thermal diffusion capacity. Accordingly, the vapor chamber can be preferably applied as a heat dissipation device.

In addition, the vapor chamber according to the present invention is advantageous for size reduction, especially for thickness reduction. Accordingly, the vapor chamber can be suitably used in devices, such as electronic devices, of which the size reduction is demanded.

REFERENCE SIGNS LIST 1, 2, 3, 4 vapor chamber
10A, 10B, 10C housing
11A, 11B, 11C, 11a, 11b, 11c first sheet
12A, 12B, 12C, 12a, 12b, 12c second sheet
13 cavity
20 working liquid
30 wick structure
31 protrusion
32 mesh
40 pillar
50 support member
X joint portion
Y inclined portion
Z bottom portion
θ angle of inclined portion of first sheet

The invention claimed is:

1. A vapor chamber comprising:
a housing having a first sheet and a second sheet that oppose each other, that are joined to each other in a peripheral region of the housing, and that define an internal space;
a working liquid enclosed in the internal space of the housing;
a wick structure on an internal principal surface of the first sheet that opposes the second sheet; and
multiple pillars on an internal principal surface of the second sheet that opposes the first sheet, wherein
the first sheet includes an inclined portion that is disposed along at least part of the peripheral region of the housing and is inclined in a height direction of the housing toward a joint portion where the first sheet is joined to the second sheet,
a first portion of the second sheet in a first region in contact with the joint portion to which the inclined portion of the first sheet extends to heightwise overlaps a second portion of the second sheet in a second region that is in contact with the pillars as viewed in a direction orthogonally intersecting a direction in which the first sheet and the second sheet oppose each other, and
the first portion of the second sheet has the same thickness as a sum of a thickness of the second portion of the second sheet and a height of the pillars.

2. The vapor chamber according to claim 1, wherein an angle of the inclined portion of the first sheet as viewed in a cross section of the vapor chamber is 1° to 17°.

3. The vapor chamber according to claim 1, wherein the inclined portion is along an entirety of the peripheral region of the housing.

4. The vapor chamber according to claim 1, further comprising:
a support member that supports at least the inclined portion of the first sheet from an outside of the housing.

5. The vapor chamber according to claim 1, wherein the wick structure further includes a mesh, a nonwoven fabric, or a porous member on a surface of the wick structure opposite to a surface thereof that opposes the internal principal surface of the first sheet.

6. The vapor chamber according to claim 1, wherein an outside surface of the second sheet in the first region is in a same plane as that of an outside surface of the second sheet in the second region.

* * * * *